United States Patent [19]

Wu et al.

[11] Patent Number: 4,859,619
[45] Date of Patent: Aug. 22, 1989

[54] EPROM FABRICATION PROCESS FORMING TUB REGIONS FOR HIGH VOLTAGE DEVICES

[75] Inventors: Tsung-Ching Wu, San Jose; Geeng-Chuan Chern, Campbell; James C. Hu, Saratoga, all of Calif.

[73] Assignee: Atmel Corporation, San Jose, Calif.

[21] Appl. No.: 219,924

[22] Filed: Jul. 15, 1988

[51] Int. Cl.$^4$ .................... H01L 21/265; H01L 29/96
[52] U.S. Cl. ........................ 437/43; 437/45; 437/52; 437/56; 357/23.5; 357/41; 148/DIG. 126
[58] Field of Search .................. 437/43, 52, 45, 56, 437/70; 357/23.5, 41, 42, 44; 148/DIG. 126

[56] References Cited

U.S. PATENT DOCUMENTS

| | | | |
|---|---|---|---|
| 4,377,818 | 3/1983 | Kuo et al. | 357/23.5 |
| 4,422,092 | 12/1983 | Guterman | 357/41 |
| 4,516,313 | 5/1985 | Turi et al. | 357/23.5 |
| 4,554,729 | 11/1985 | Tanimura et al. | 437/52 |
| 4,613,885 | 9/1986 | Haken | 357/42 |
| 4,696,092 | 9/1987 | Doering et al. | 437/5 |
| 4,719,184 | 1/1988 | Cantarelli et al. | 437/24 |

*Primary Examiner*—Olik Chaudhuri
*Attorney, Agent, or Firm*—Thomas Schneck

[57] ABSTRACT

A process of fabricating high performance EPROMs in which memory cell devices and high voltage circuit devices are formed in p-type tub regions of high threshold voltage. The tub regions are formed by implanting boron ions in photolithographically defined memory cell and high voltage device areas of a p-type wafer substrate, then subjecting the substrate to a high temperature drive-in. The N-channel isolation field is formed separately and has a lower threshold voltage than the tub regions. The isolation field is formed by implanting boron ions around all device areas, including low voltage device areas, using a nitride mask and a low implantation energy. The wafer is then subjected to an anneal step followed by a field oxidation step. The memory cell and other MOS devices are finally formed in the appropriate defined regions. Since the isolation field's threshold voltage can be adjusted separately from the tub regions, the threshold voltage of the field can be reduced making it possible to reduce the isolation spacing of low voltage devices, reduce parasitic capacitance and increase device speed.

10 Claims, 3 Drawing Sheets

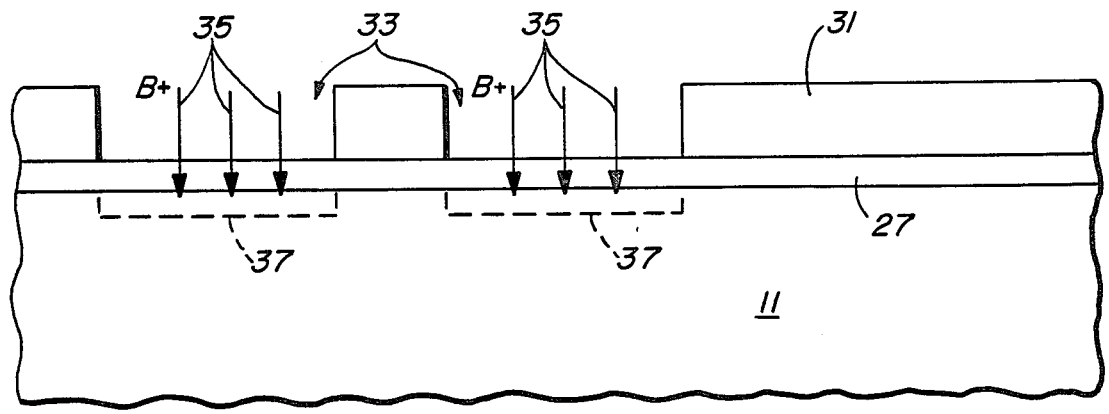
FIG._1
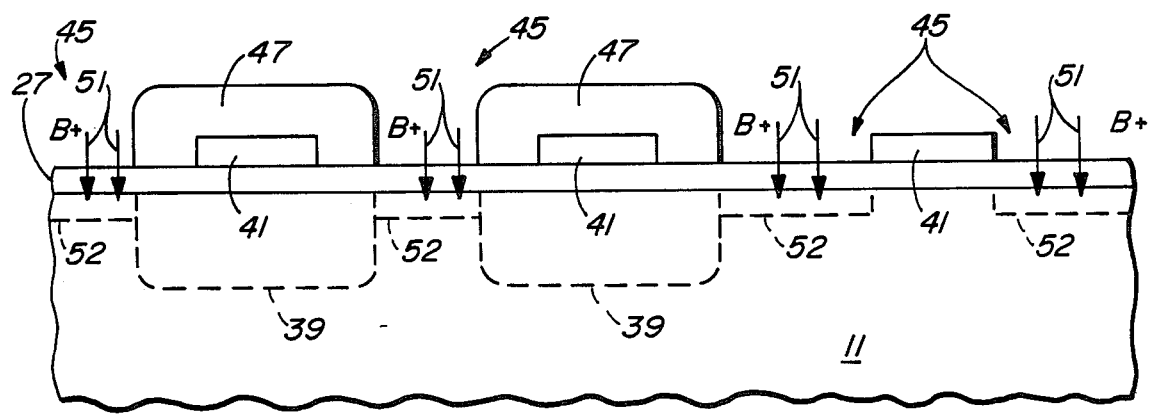
FIG._2
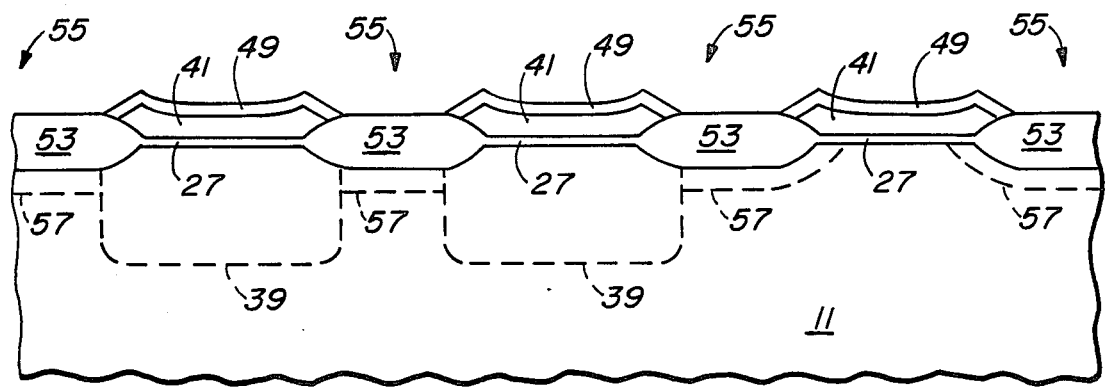
FIG._3

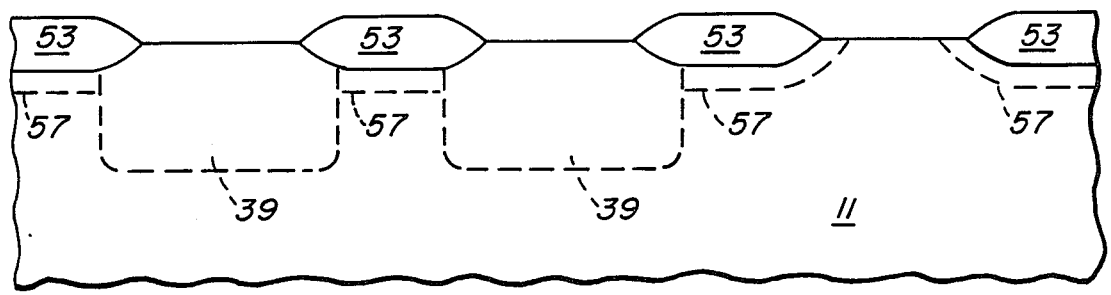
FIG._4
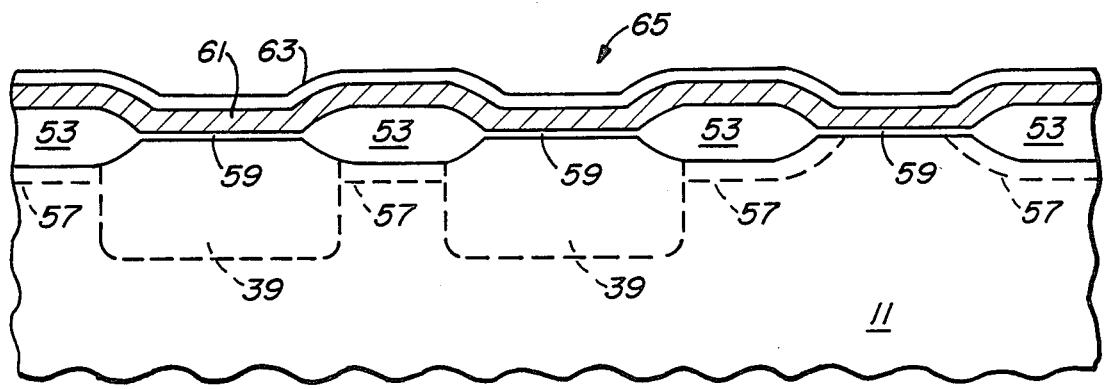
FIG._5
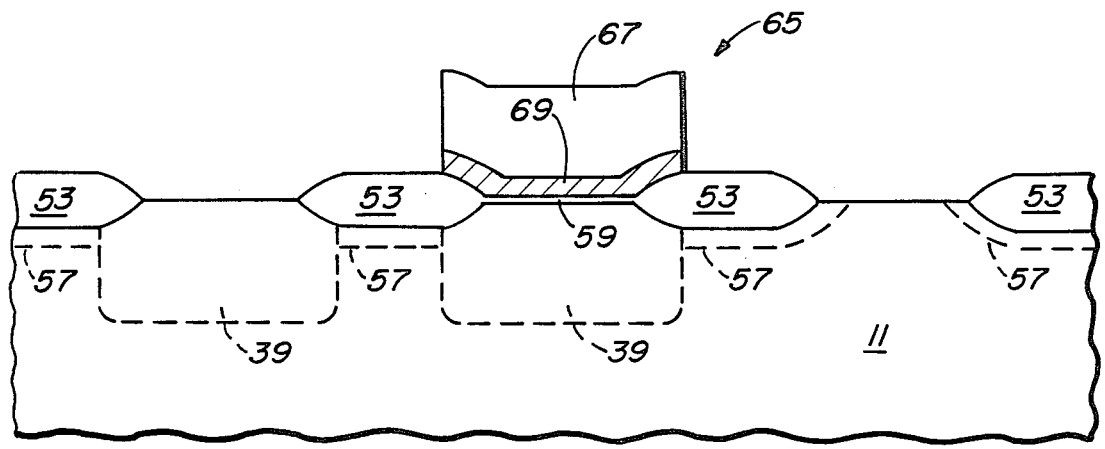
FIG._6

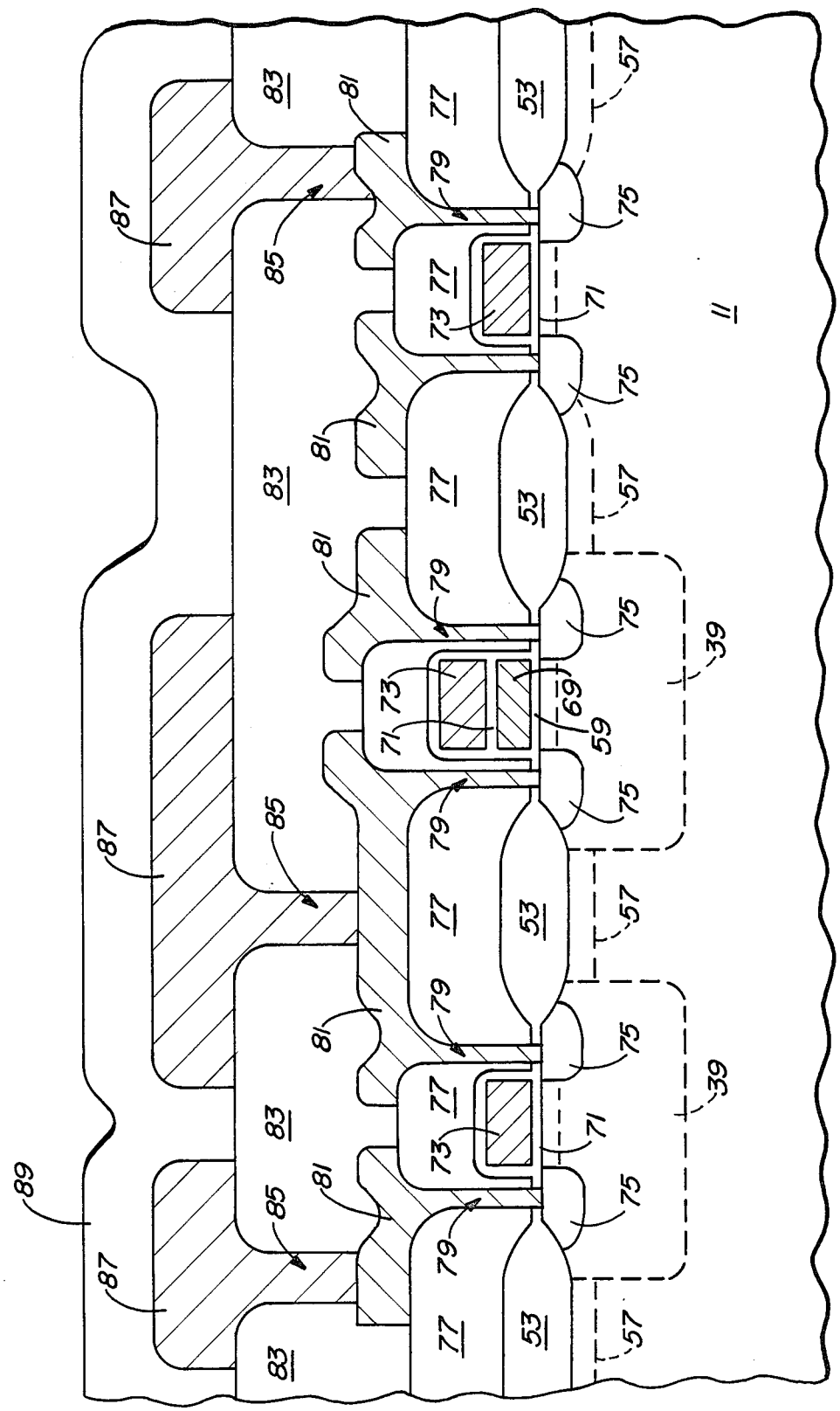
FIG._7

EPROM FABRICATION PROCESS FORMING TUB REGIONS FOR HIGH VOLTAGE DEVICES

TECHNICAL FIELD

The present invention relates to fabrication of erasable programmable read-only memory (EPROM) devices, especially devices which include high-breakdown-voltage peripheral transistors, and in particular to fabrication processes using metal-oxide-semiconductor (MOS) technologies.

BACKGROUND ART

Erasable programmable read-only memory (EPROM) devices are usually fabricated by employing metal-oxide-semiconductor (MOS) transistors with a double-layer polysilicon gate structure as the memory cells in a memory cell array. The first polysilicon gate of the MOS transistor is completely insulated from any outside connection and is called a "floating gate". Information can be programmed in the memory array by avalanche injection of charge carriers into the floating gate through a thin insulation layer from the substrate. The memory cell is thus called a floating gate avalanche injection MOS (FAMOS) device. Since the floating gate is surrounded by an insulation layer, the charges, once trapped, stay inside the floating gate during normal storage and operation conditions. The erasure of information from an EPROM device is accomplished by exposing the device to ultraviolet light with high enough energy to excite the stored charges to escape from the floating gates. After the information stored on all memory cells is completely purged, new information can be written electrically into the array.

Like other ROMs, EPROMs include, beside an array of memory cells, addressing circuitry with peripheral transistors for providing access to specific memory cells so as to enable the contents of the memory cells to be read out or written. Some of the peripheral transistors, such as those controlling programming, may be required to have a high breakdown voltage, while others, used only for reading data and operating at normal signal voltages, have lower breakdown voltages.

In order to program an EPROM efficiently, it is necessary to produce a large electric field near the drain junction under the gates of specific FAMOS devices for charge generation and injection. An electric field is achieved by applying a high voltage to the gate and the drain of the FAMOS device. Because of the high voltage applied when programming an EPROM, the isolation field area must have a high enough threshold voltage to prevent two adjacent active devices from shorting. This high field threshold voltage is usually achieved by a higher field implant dose which results in higher parasitic capacitance and slower device characteristics. Unless a separated field implant mask and a lower dose of field implant are applied to the devices in the speed path, these devices will have a similar higher parasitic capacitance and slower device characteristics. It then results in a slower product speed.

It is an object of the present invention to provide a process of fabricating EPROMs having higher speed and performance characteristics.

DISCLOSURE OF THE INVENTION

The above object has been met with an EPROM fabrication process which first forms P-tub regions for the memory cell devices and high voltage circuit devices. The P-type dose of the P-tub also serves as the channel implant for EPROM programming. This eliminates the need to make the isolation field outside of memory cell and high voltage device areas with a high threshold voltage, thereby reducing parasitic capacitance of the devices in the speed path and resulting in higher speed devices. Further, because the field threshold can now be adjusted separately, independent of the EPROM programming voltage requirements, it is better technology to combine any logic or microprocessor with an EPROM memory.

Briefly, the process begins with a P-type substrate on which memory cell and high voltage device areas are photolithographically defined. Boron is implanted in these areas and the wafer is subjected to a high temperature drive-in cycle to form the P-tub regions. After drive-in, a 1000–2500 Å thick silicon nitride film is deposited, then selectively etched to define active regions. Field boron ions are implanted in the isolation field for a low field threshold voltage, using a low implant energy (25–50 KeV) to prevent them from penetrating the nitride film. A field oxidation cycle is performed, preceded by a high temperature boron anneal step to form channel stop regions. A first gate oxide layer is grown and a first polysilicon layer, which will form the floating gates of memory cell devices, is deposited then selectively etched away from all areas other than memory cell areas. The process continues as in the prior art, namely the growing of a second oxide layer, deposition and selective removal of a second polysilicon layer to form gates, implantation to form N+ sources and drains, and formation of an interconnecting circuit pattern of conductive lines which are separated by insulative material.

The process, which may be used for both NMOS and CMOS EPROMs, allows a circuit designer larger latitude to design high and low voltage circuits separately so that EPROM performance and speed can be greatly improved.

BRIEF DESCRIPTION OF THE DRAWINGS

FIGS. 1–7 are side sectional views of a portion of a high performance EPROM in various stages of completion illustrating an EPROM fabrication process of the present invention.

BEST MODE FOR CARRYING OUT THE INVENTION

The following disclosure describes the process steps for NMOS fabrication of an EPROM in accordance with the present invention. The present invention is also applicable for producing CMOS EPROMs. For CMOS fabrication, N-well and P+ region formation steps are added to make p-channel devices. These additional steps are well known and are described in the prior art. In either case, NMOS or CMOS, N-channel memory cells are employed in EPROMs produced by the present invention, and their fabrication is described below.

With reference to FIG. 1, the starting material is a P-type (100)-oriented monocrystalline silicon substrate 11 doped to a level sufficient to provide a resistivity in the range of 5–50 Ohm-cm. If a CMOS EPROM is fabricated, an N-well region is formed on part of the wafer to be ready for P-channel devices. The wafer is then subjected to an $O_2$/HCl ambient at 800°–1000° C. to thermally grow a silicon dioxide layer 27 of 250°–1000 Å thickness. A photolithographic technique using a photoresist mask 31 is applied to define the areas 33 for memory cell array, cell devices and high voltage circuits. Boron is then implanted in areas 33, as indicated by arrows 35 and implant boundary 37. The boron implant dose is about $0.5$–$4 \times 10^{13}/cm^2$, and the implantation energy is 100–200 KeV. Mask 31 is subsequently stripped.

After extensive cleaning procedures, the wafer is subjected to a drive-in cycle at 1000°–1150° C. for two to six hours. This results in a P-tub region 39, as shown in FIG. 2, with a depth of 1–2 $\mu$ m and a proper doping profile such that this tub region has a deep field threshold voltage higher than 15 volts while the memory cell device at the surface has a threshold voltage in the range of 1–2 volts. After drive-in, a silicon nitride film 41 of 1000–2500 Å thickness is deposited by a low pressure chemical vapor deposition (LPCVD) method. Then, through a photolithographic step using a photoresist mask, this silicon nitride layer 41 is etched to define active regions. The etching is done by a plasma chemistry technique using $SF_6$ or $CF_4/O_2$ as the etchant. The silicon dioxide layer 27, grown previously, assures that wafer substrate 11 is free from possible point defects or line defects, such a dislocation and subgrain boundaries, induced by the large build-in stress ($2 \times 10^{19}$ dyn/$cm^2$) of silicon nitride films. The thickness ratio of silicon nitride to silicon dioxide should be in the range from 1:1 to 7:1 to minimize the stress.

After removal of resist and cleaning, another photolithographic step is employed in which isolation field implant regions 45 are defined by a photomask 47. Photomask 47 is used to cover the N-well region in CMOS processes and to cover the P-tub region 39 prior to low voltage N-channel isolation field formation. Field boron ions are then implanted into regions 45 as indicated in FIG. 4 by arrows 51 and implant boundaries 52. The implant dose is about $0.4$–$3 \times 10^{13}/cm^2$, and the implant energy within the range of 25–50 KeV. Use of this low implant voltage and the nitride layer 41, which is generally thicker than that used in the prior art, prevents boron ions from penetrating through the nitride layer 41 and then into the substrate 11. Resist layer 47 is stripped, and the wafer is cleaned after implantation.

Following the field implantation, a field oxidation cycle is performed. As a result of this cycle, a 0.6–1.2 $\mu$m thick field oxide layer 53, seen in FIG. 3, is grown in the isolation area 55 using the patterned nitride layer 41 as an oxidation mask. It is desirable that the field oxide 53 and channel stop regions 57, also seen in FIG. 3, be formed at the same time. Therefore, the field oxidation cycle includes both a high temperature (950°–1050° C.) boron anneal step in an $N_2$ ambient and a lower temperature (900°–1000° C.) oxidation step in a steam ($H_2/O_2$) ambient. The drive-in prior to oxidation is necessary to prevent boron in the channel stop regions 57 from being leached out in the subsequent oxidation cycles.

A thin silicon dioxide layer 49 is formed on the top of silicon nitride layer 41 during the field oxidation process, the top surface of silicon nitride layer 41 being converted to silicon dioxide due to long hours process in the steam environment. The thickness of this silicon dioxide layer 49 is about 1–4% of the thickness of field oxide 53. Thus top oxide layer 49 needs to be removed before the silicon nitride strip. About 250–800 Å of silicon dioxide is etched off using BOE solution followed by stripping the silicon nitride layer 41 in hot phosphoric acid at an etch rate of 60–100 Å per minute. Lastly the 250–1000 Å thick bottom oxide layer 27 that was under the nitride layer 41 is removed, followed by extensive wafer cleaning. The condition shown in FIG. 4 is the result.

With reference to FIG. 5, the first gate oxidation 59 is grown in an alternation $O_2$/HCl and $O_2/N_2$ atmosphere at 750°–1100° C. The thickness of this layer 59 is about 250–350 Å. The first gate oxide 59 will be used in a memory cell area 65. An LPCVD polycrystalline silicon layer 61 of 1500–3000 Å thickness, and preferably less than 2500 Å thick, is then formed over the first gate oxide layer 59. The major gas used in this deposition step is $SiH_4$ (silane), and the deposition temperature is 600°–700° C. Polysilicon layer 61 is thinner than that usually found in the prior art, first polysilicon layers of the prior art generally being greater than 2600 Å thickness and typically having a thickness of above 3000 Å. Polysilicon layer 61 is doped to achieve the desired sheet resistance. Doping is by diffusion, employing $POCl_3$ or $PH_3$ (phosphine) at a temperature of 900° to 950° C. A phosphorus concentration of $10^{20}$–$10^{21}/cm^3$ is required to reduce the sheet resistance of polysilicon layer 61 to about 15–40 Ohm/square. Phosphorus glass 63, which is formed over the polysilicon layer 61 during doping, is removed with a buffered oxide etchant.

A photoresist layer 67 is next placed on the polysilicon film 61, and using regular photolithographic techniques the first polysilicon region 69 inside the memory cell area 65 is defined. The polysilicon film 61 is then etched off the non-core regions not covered by resist 67 using a plasma etch in a reactive ion etching mode. The chemistry chosen for this step is $SF_6/CCl_4$ or $Cl_2/O_2$. After etching, resist 67 is stripped, and the oxide layer 59 is removed from all wafer areas, except for oxide underneath the first polysilicon region or memory device area 69. Buffered oxide etchant is used with the polysilicon to extensive cleaning steps. The condition shown in FIG. 6 is the result before resist removal.

Referring to FIG. 7, the process continues and is completed by the rest of the steps used in the prior arts. A second oxide layer 71 is thermally grown over the substrate 11 and first polysilicon layer 69 at a temperature of 1100° to 1200° C. This second oxide layer 71 has a substantially uniform thickness over both the substrate 11 and polysilicon material 69. After adjusting the threshold of any enhancement devices, a second gate layer 73, of polysilicon or of a polysilicon/silicide sandwich, is deposited and selectively removed, together with the second oxide layer 71, to define gates. The floating gate is then defined by selectively removing the first polysilicon layer 69 and first gate oxide layer 59, using the second gate layer 73 of the memory device as a self-aligning mask. The N+ source and drain regions 75 are formed by implanting arsenic ions to a dose of $4$–$6 \times 10^{15}/cm^2$ at an implantation energy of 70–100 KeV using a photoresist mask. The final interconnect is accomplished by first depositing a boron/phosphorous-doped silica glass (BPSG) 77 to cover the wafer surface. A high temperature anneal step at 900°–1000° C. in alternating $H_2/O_2$ and $N_2$ ambients is employed to flow the BPSG surface. The contact holes 79 are then opened through a regular photolithographic technique with wet/dry etching. To further smooth the sharp corners, the wafer is subjected to a heat treatment at approximately 900°–1000° C. for producing reflow of the etched BPSG layer 77. Prior to the reflow cycle, all the contact holes 79 to N+ regions 75 and to polysilicon regions 73 are implanted with phosphorus ions to a dose in the range of $2-8 \times 10^{15}/cm^2$ at an implant energy of 50-150 KeV and the silicon dioxide and polysilicon layers on the backside of the wafer are removed by covering the front side of the wafer with a 2-4 μm thick resist and then etching in BOE and dry plasma. The metal layer 81 deposited over the glass 77 is etched to define a first layer of conductive lines. If a second layer is needed, an intermetal layer 83 of oxynitride, phosphorus-doped silica glass (PSG) or both with via holes 85 therein is formed and the second layer of conductive lines 87 formed over the intermetal layer 83. The rough surface of the intermetal layer 83 is planarized by etch-back and redeposition techniques, and the sharp corners of the via holes 85 smoothed by wet and dry etching techniques prior to the second metal deposition. The wafer is finally finished by depositing a composite layer 89 of plasma enhanced oxynitride and atmospheric pressure chemical vapor deposition (APCVD) PSG as the passivation layer and opening windows to bonding pads through regular photolithographic techniques. The condition shown in FIG. 7 is the final result.

We claim:

1. An EPROM fabrication process comprising,
   forming P-type tub regions for memory cell and high voltage device areas on a P-type wafer substrate,
   forming an isolation field around memory cell, high voltage and low voltage device areas in said substrate, said isolation field outside of P-type tub regions being characterized by a lower deep threshold voltage than said P-type tub regions,
   forming at least one memory cell device in memory cell device areas of said substrate, said memory cell device having a floating gate, a second gate above said floating gate, a drain and a source associated therewith,
   forming MOS devices in said high voltage and low voltage device areas of said substrate, said MOS devices having gates drains and sources associated therewith, and
   forming a circuit pattern of electrically conductive lines connected to selected sources, drains and gates of said MOS and memory cell devices and separated by insulative material.

2. The process of claim 1 wherein forming P-type tub regions comprises,
   photolithographically defining memory cell and high voltage device areas in said wafer substrate,
   implanting boron ions in said memory cell and high voltage device areas of said substrate, and
   thermally driving-in said boron ions to form said tub region, said tub region having a deep threshold voltage over at least 15 volts and a surface threshold of voltage of less than 2 volts.

3. The process of claim 2 wherein implanting boron ions is done to a dose in a range from 0.5 to $4 \times 10^{13}/cm^2$ with an implantation energy of 100-200 KeV, and wherein thermally driving in said boron ions comprises heating said substrate to a temperature of 1000°-1150° C. for a period of 2 to 6 hours.

4. The process of claim 1 wherein forming said isolation field comprises,
   depositing a silicon nitride layer on said substrate,
   photolithographically defining memory cell, high voltage and low voltage device areas in said nitride layer, and selectively removing said nitride layer from regions around said defined areas,
   implanting boron ions in said substrate around low voltage devices with a low implantation energy,
   annealing said boron implanted substrate,
   oxidizing surface areas of said substrate around said memory cell, high voltage and low voltage device areas, and
   removing remaining portions of said nitride layer.

5. The process of claim 4 wherein boron ions are implanted in said substrate around all N-channel devices and memory cell device areas.

6. The process of claim 4 wherein said nitride layer is deposited to a thickness of 1000-2500 Å, and wherein implanting boron ions is done with an implantation energy of 25-50 KeV.

7. An EPROM fabrication process comprising,
   photolithographically defining memory cell and high voltage device areas in a p-type wafer substrate,
   implanting boron ions in said memory cell and high voltage device areas of said substrate,
   thermally driving-in said boron ions to form p-type tub regions in said memory cell and high voltage device areas of said substrate, said tub regions having a deep field threshold voltage of at least 15 volts,
   depositing a silicon nitride layer on said substrate,
   photolithographically defining memory cell, high voltage and low voltage device areas in said nitride layer and selectively removing said nitride layer from regions around said defined areas,
   implanting boron ions in an isolation field of said substrate around said defined device areas with a low implantation energy,
   annealing said boron implanted substrate,
   oxidizing surface areas of said substrate around said defined device areas to define a field oxide layer,
   removing remaining portions of said nitride layer,
   forming at least one memory cell device in said memory cell device areas of said substrate, said memory cell device having a floating gate, a second gate above said floating gate, and a drain and a source in said substrate adjacent to said floating gate,
   forming high-breakdown-voltage and low-breakdown-voltage MOS devices in said respective high voltage and low voltage device areas of said substrate, said MOS devices having gates, drains and sources associated therewith, and
   forming a circuit pattern of electrically conductive lines connected to selected sources, drains and gates of said MOS and memory cell devices and separated by insulative material.

8. The process of claim 7 wherein forming said at least one memory cell device comprises,
   thermally growing a first gate oxide layer over said wafer substrate,
   depositing a first polysilicon layer over said first gate oxide layer, said first polysilicon layer having a thickness in the range from 1500 to 3000 Å,
   thermally growing a second oxide layer over said first polysilicon layer,
   depositing a second polysilicon layer over said second oxide layer,
   selectively removing said second polysilicon layer and said second oxide layer so as to define a memory cell,
   selectively removing said first polysilicon layer and said first oxide layer using said memory cell gate as a self-aligning mask so as to define a floating gate, and
   forming a drain and a gate in said substrate adjacent to floating gate.

9. The process of claim 7 wherein implanting boron ions in said memory cell and high voltage device areas is done to a dose in a range from 0.5 to $4 \times 10^{13}/cm^2$ with an implantation energy of 100–200 KeV, and wherein thermally driving in said boron ions comprises heating said substrate to a temperature of 1000°–1150° C. for a period of 2 to 6 hours.

10. The process of claim 7 wherein said nitdride layer is deposited to a thickness of 1000–2500 Å, and wherein implanting boron ions in said isolation field is done to within an implantation energy of 25–50 KeV.

* * * * *